United States Patent
Fisher et al.

(10) Patent No.: US 7,498,295 B2
(45) Date of Patent: *Mar. 3, 2009

(54) ALKALINE CHEMISTRY FOR POST-CMP CLEANING COMPRISING TETRA ALKYL AMMONIUM HYDROXIDE

(75) Inventors: Matthew L. Fisher, Allen, TX (US); Ashutosh Misra, Plano, TX (US)

(73) Assignee: Air Liquide Electronics U.S. LP, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/831,161

(22) Filed: Jul. 31, 2007

(65) Prior Publication Data

US 2008/0047592 A1 Feb. 28, 2008

Related U.S. Application Data

(63) Continuation-in-part of application No. 10/956,273, filed on Oct. 1, 2004, now Pat. No. 7,435,712.

(60) Provisional application No. 60/544,272, filed on Feb. 12, 2004.

(51) Int. Cl.
*C11D 3/30* (2006.01)
*C11D 7/06* (2006.01)
*C11D 3/20* (2006.01)

(52) U.S. Cl. ............. 510/175; 510/176; 510/254; 510/255; 510/259; 510/272; 134/1.2; 134/1.3

(58) Field of Classification Search ........... 510/175, 510/176, 254, 255, 259, 272; 134/1.2, 1.3
See application file for complete search history.

(56) References Cited

U.S. PATENT DOCUMENTS

| | | | |
|---|---|---|---|
| 6,191,086 B1 | 2/2001 | Leon et al. | |
| 6,194,366 B1 | 2/2001 | Naghshineh et al. | |
| 6,200,947 B1 | 3/2001 | Takashima et al. | |
| 6,465,403 B1 * | 10/2002 | Skee | 510/175 |
| 6,492,308 B1 | 12/2002 | Naghshineh et al. | |
| 6,585,825 B1 * | 7/2003 | Skee | 134/3 |
| 6,599,370 B2 * | 7/2003 | Skee | 134/3 |
| 2002/0094939 A1 | 7/2002 | Sachdev et al. | |
| 2006/0148666 A1 | 7/2006 | Peters et al. | |
| 2006/0154839 A1 * | 7/2006 | Ilardi et al. | 510/175 |
| 2006/0166847 A1 | 7/2006 | Walker et al. | |
| 2006/0229221 A1 | 10/2006 | Walker et al. | |

FOREIGN PATENT DOCUMENTS

| | | |
|---|---|---|
| EP | 1 128 221 | 8/2001 |
| EP | 1 266 956 | 1/2003 |
| WO | WO 01 95381 | 12/2001 |
| WO | WO 03 006598 | 1/2003 |

OTHER PUBLICATIONS

International Search Report for PCT/IB2005/000081.

* cited by examiner

*Primary Examiner*—Charles I Boyer
(74) *Attorney, Agent, or Firm*—Brandon Clark

(57) ABSTRACT

This disclosure discusses cleaning of semiconductor wafers after the Chemical-Mechanical Planarization (CMP) of the wafer during the manufacturing of semiconductor devices. Disclosed is an alkaline chemistry for the post-CMP cleaning of wafers containing metal, particularly copper, interconnects. Residual slurry particles, particularly copper or other metal particles, are removed from the wafer surface without significantly etching the metal, leaving deposits on the surface, or imparting significant contamination to the wafer while also protecting the metal from oxidation and corrosion. Additionally, at least one strong chelating agent is present to complex metal ions in solution, facilitating the removal of metal from the dielectric and preventing re-deposition onto the wafer.

17 Claims, 2 Drawing Sheets

A 20 X 20 micron AFM image of a Cu pad on a patterned wafer exposed to a 1:20 dilution of a preferred embodiment of the present invention.

RMS roughness = 1.6 nm.

A 1 X 1 micron AFM image of Cu and low k lines on a patterned wafer exposed to a 1:20 dilution showing copper lines are not substantially recessed by the cleaning solution of the invention.

ALKALINE CHEMISTRY FOR POST-CMP CLEANING COMPRISING TETRA ALKYL AMMONIUM HYDROXIDE

CROSS REFERENCE TO RELATED APPLICATIONS

This application is related to and claims the benefit of U.S. Provisional Application No. 60/544,272, filed Feb. 12, 2004, and U.S. patent application Ser. No. 10/956,273, filed Oct. 1, 2004. These applications are incorporated herein by this reference.

BACKGROUND

Manufacturing of electronic wafer chips involves a step wherein semiconductor work-pieces are cleaned with a liquid solution during or after Chemical Mechanical Planarization (CMP). A "semiconductor work-piece" is a microelectronic device that has not completed the fabrication process, typically a silicon wafer with active regions formed in or on the surface of the silicon wafer. Connections to the active regions are made using multiple layers of metal, typically copper and tungsten, which has been deposited on the silicon substrate. When copper is used as the interconnect material, a damascene process is used whereby the copper is deposited into lines etched into the inter-layer dielectric and then the excess copper is removed and the surface planarized using a CMP process, followed by a cleaning step. The goal of the cleaning process ("Post-CMP cleaning") is to remove residues left by the CMP step from the semiconductor work-piece surface without significantly etching the metal, leaving deposits on the surface, or imparting significant contamination to the semiconductor work-piece. Furthermore, it is desirable to protect the metal surfaces from corrosion by various mechanisms such as chemical etching, galvanic corrosion or photo-induced corrosion. Corrosion of the metal surfaces results in metal recess and thinning of the metal lines. Since neutral to alkaline slurries are often utilized in copper and barrier CMP, it is desirable to have a cleaning solution that is effective in the alkaline pH regime where the abrasive particles are highly charged and can be removed efficiently. Alkaline chemistries are often utilized in a brush scrubber or megasonic cleaning unit for Post-CMP cleaning.

A cleaning solution may contain various chemicals that perform different functions during the cleaning process. A cleaning solution must contain a "cleaning agent." A "cleaning agent" is the component of solution that removes residual CMP slurry particles, typically particles of metal, from the surface of the semiconductor work-piece. A cleaning solution may also contain "chelating agents," "corrosion-inhibiting compounds," and/or "surface-active agents." A "chelating agent" helps prevent re-deposition of removed metal onto the semiconductor work-piece by complexing the metal in the cleaning solution. A "corrosion-inhibiting compound" is the component of the cleaning solution that protects the metal surface from attack by mechanisms such as the aggressive nature of the cleaning solution, oxidation, post cleaning corrosion, galvanic attack, or photo-induced attack. A "surface-active agent" is a component of the cleaning solution that modifies the wetting characteristics and prevents watermark formation.

U.S. Pat. Nos. 6,200,947, 6,194,366, and 6,492,308 disclose relevant to the chemistries of cleaning solutions. However, these references suffer from one or more of the disadvantages discussed below.

The ability of the cleaning chemistry to remove residual metals and retain them in the cleaning solution is an important characteristic of a Post-CMP cleaning solution. Chemicals that can complex the residual metal in the cleaning solution are effective cleaning agents because the residual metals are not re-deposited on the semiconductor work-piece after they are removed. Cleaning solutions using chemistry that cannot complex the residual metals typically perform poorly at the desired cleaning task. Thus, it is desirable to have a cleaning solution that includes a chelating agent.

Some commercially available alkaline chemistries have poor performance at the desired function of removing residual metal, particularly copper, from dielectric lines because the do not contain a chelating agent. Such chemistries typically comprise an aliphatic alcohol compound containing a mercapto group, such as 2-mercaptoethanol or thioglycerol, and a solution of an alkaline compound, such as a hydroxide.

It is important to protect semiconductor work-pieces from corrosion of the metal surfaces by providing a corrosion-inhibiting compound in the cleaning solution. The metal surfaces of the semiconductor work-piece, typically copper, form the conducting paths of the semiconductor wafer. Due to the very small size of features on semiconductor wafers, the metal lines are as thin as possible while still carrying the desired electric current. Any corrosion on the surface or recess of the metal causes thinning of the lines (dissolution) and results in poor performance or failure of the semiconductor device. The cleaning solution's corrosion preventing abilities are quantified by measuring the static etch rate or the surface roughness (quantified by RMS, root mean square, value) of a metal surface that has been cleaned with the subject solution. A high static etch rate indicates dissolution of the metal surface is occurring. A high RMS value indicates a rough surface caused by attack of the metal at the grain boundaries. An effective corrosion-inhibiting compound reduces the corrosion of the metal as indicated by lower static etch rate and RMS values measured after the cleaning step.

Corrosion-inhibiting compounds function by either reducing the surface of the metal, providing a protection film on the surface of the metal, or scavenging oxygen. Some cleaning solutions available in the art do not provide effective corrosion-inhibiting agents and thus suffer from a high static etch rate and/or high RMS value.

Some commercially available alkaline cleaning chemistries are affected by exposure to air and/or have a high static etch rate of the metal. Such chemistries typically contain a quaternary ammonium hydroxide, such as TMAH, a corrosion-inhibitor of the oxygen scavenging type, such as gallic acid or ascorbic acid, and an organic amine, such as monoethanolamine. Because these chemistries rely on an oxygen scavenger to prevent corrosion, exposure to air is detrimental to the performance of the chemical. Also, the lack of a protective surface film and the aggressiveness of the chemistries towards the metal result in a high static etch rate, which then causes recessed lines.

Another common problem with cleaning semiconductor surfaces is the deposition of contaminants on the surface of the semiconductor device. Any cleaning solutions that deposit even a few molecules of undesirable composition will adversely affect the performance of the semiconductor device. Cleaning solutions that require a rinsing step can also result in depositing contaminants on the surface. Thus, it is desirable to use a cleaning chemistry that will not leave any residue on the semiconductor surface.

It is also desirable to clean and protect the semiconductor surface in a single step. Some chemistries for planarizing a wafer surface include a cleaning step followed by an additional step of rinsing with water or an inhibitor solution. Rinsing, particularly with water, can result in leaving deposits on the surface of the semiconductor work-piece, thus contaminating the wafer. Adding a second step is also a drawback due to the fact that it lengthens the manufacturing process, complicates the process by having to handle more chemicals and more steps, and provides one more possible source of contamination or other quality control problems. Clearly, a process that cleans and protects the surface of the semiconductor work-piece is desirable.

It may also be desirable to have a surface wetting agent in the cleaning solution. Surface wetting agents prevent contamination of the semiconductor work-piece by helping to stop spotting of the surface caused by droplets clinging to the surface. Spotting (also called watermarks) on the surface can saturate metrology tools that measure light point defects, thus masking defects in the semiconductor work-piece.

For the foregoing reasons, it is desirable to provide an alkaline chemistry that protects the metal from corrosion, prevents oxidation of the metal surface, removes particles efficiently, removes metal from the dielectric surface, is close to the pH of the prior CMP step, and does not contaminate the semi conductor surface. The chemistry of the current invention makes use of multiple additives to provide a solution that fulfills all of the above needs.

SUMMARY

This invention relates to cleaning chemicals used after Chemical Mechanical Planarization (CMP) of semiconductor substrates containing metal, particularly copper. Alkaline chemistries are often utilized in a brush scrubber or megasonic cleaning unit for removal of slurry particles and organic residues from the wafer surface. The current invention is a composition of a cleaning solution for cleaning a semiconductor work-piece that satisfies the need to protect the metal from corrosion, prevents oxidation of the metal surface, removes particles efficiently, removes metal from the dielectric surface, is close to the pH of the prior CMP step, does not add organic residue to the work-piece, and does not contaminate the semi conductor surface. Furthermore, the cleaning and protecting the metal surfaces are completed in a single step with a single solution.

The cleaning solution of the current invention is alkaline in nature to match the pH of alkaline CMP slurries. Silica based CMP slurries are often stabilized in the alkaline pH region where the particles exhibit a highly negative surface charge. Cleaning with an alkaline pH chemistry results in efficient particle removal due to the charge on the particles and their repulsion from the similarly charged surface. A chelating agent is present to complex metal ions in solution, facilitating the removal of copper from the dielectric and preventing metal re-deposition onto the wafer. The cleaning solution also contains a corrosion-inhibiting agent that prevents the oxidation of copper and minimizes the attack of the metal surface by the cleaning agent. Additionally, the chemistry may contain an oxygen scavenger that is catalyzed by the presence of copper, to further minimize the possibility of corrosion. Optionally, wetting agents can be added to modify the wetting characteristics and prevent watermark formation.

Preferred embodiments of cleaning solution comprise a cleaning agent, a chelating agent, and a corrosion-inhibiting compound.

The cleaning agents of the current invention efficiently clean the surface of the semiconductor work-piece by removing CMP slurry particles from the semiconductor work-piece as well as cleaning residual metal from the dielectric surfaces. Preferred embodiments of cleaning solution include ammonium hydroxide, and/or a tetra alkyl ammonium hydroxide as cleaning agents.

Preferred embodiments of the cleaning solutions of the current invention include chelating agents to effectively complex the metal removed and prevent re-deposition of the removed metal on the surface of the semiconductor work-piece. Preferred chelating agents include one or more of ammonium citrate, ammonium oxalate, aspartic acid, benzoic acid, citric acid, cysteine, ethylene diamine, glycine, gluconic acid, glutamic acid, histidine, hydroxylamine, isopropanolamine, isopropylhydroxylamine, maleic acid, oxalic acid, salicylic acid, or tartaric acid.

Preferred embodiments of cleaning solutions include corrosion-inhibiting compounds to protect the metal of the semiconductor work-piece from corrosion. Corrosion-inhibiting agents may be reducing agents, film-forming agents, and/or oxygen scavenging agents. Forming a film on the metal of the semiconductor work-piece that protects metal surfaces from oxidation, and from chemical, galvanic and photo-induced attack during and after the cleaning step. By protecting the metal surface from attack, reducing the surface, or by scavenging oxygen, the metal retains its desired thickness and electrical carrying capacity. Preferred corrosion inhibitors include one or more of acetamidophenol, aminophenol, benzotriazole, caffeic acid, cinnamic acid, cysteine, dihydroxybenzoic acid, glucose, imidazole, mercaptothiazoline, mercaptoethanol, mercaptopropionic acid, mercaptobenzothiazole, mercaptomethylimidazole, methoxyphenol, propyl gallate, tannic acid, thioglycerol, thiosalicylic acid, triazole, vanillin, or vanillic acid.

The cleaning solution of the current invention is alkaline. Alkaline post CMP cleaning chemistry is desirable because some CMP processes use alkaline slurries. By using an alkaline cleaning solution, the problems associated with swinging the pH in the process equipment can be avoided.

Preferred cleaning solutions of the current invention clean the semiconductor work-piece and protect the metal surface against corrosion in the same step. Because the cleaning and corrosion inhibiting is accomplished in a single step, there is less likelihood of accidental contamination by handling a completely separate corrosion-inhibiting solution. Furthermore, valuable processing time is saved by not having to add an additional inhibiting step.

Some preferred cleaning solution embodiments include a surface-active agent, also referred to as a surface-wetting agent. The surface-active agent helps prevent spotting (watermarks) on the surface that can be a source of contamination or hide defects in the semiconductor work-piece. A surface-active agent may be a non-ionic, anionic, cationic, zwitterionic or amphoteric surfactant.

DESCRIPTION

Figure 1:
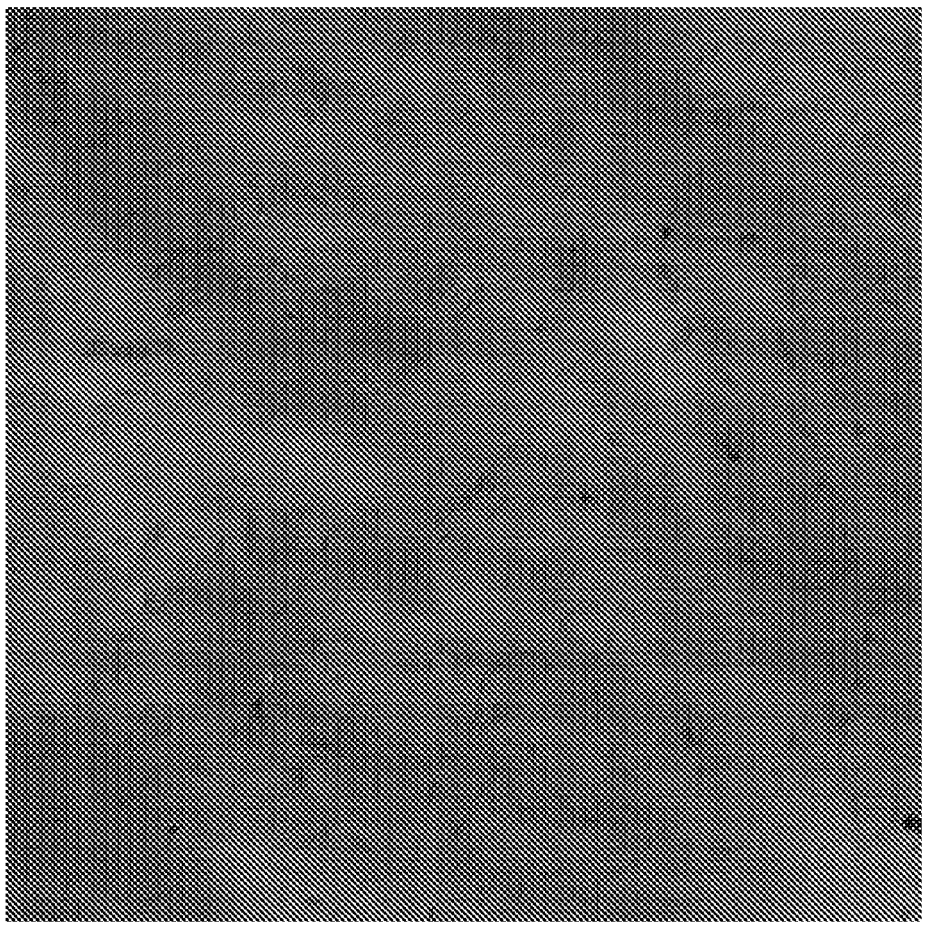
FIG. 1 is an image of a Cu pad on a patterned wafer exposed to a preferred embodiment of the invention.

The present invention is a cleaning solution for cleaning a semiconductor work-piece that is alkaline in nature. The composition of the cleaning solution comprises a cleaning agent, a chelating agent and a corrosion-inhibiting compound. Preferred cleaning agents include ammonium hydroxide and a tetra alkyl ammonium hydroxide (methyl, ethyl, propyl, butyl, etc.). Preferred chelating agents include ammonium citrate, ammonium oxalate, aspartic acid, benzoic acid, citric acid, cysteine, ethylene diamine, glycine, gluconic acid, glutamic acid, histidine, hydroxylamine, isopropanolamine, isopropylhydroxylamine, maleic acid, oxalic acid, salicylic acid, tartaric acid, and mixtures thereof. Preferred corrosion-inhibiting compounds include acetamidophenol, aminophenol, benzotriazole, caffeic acid, cinnamic acid, cysteine, dihydroxybenzoic acid, glucose, imidazole, mercaptothiazoline, mercaptoethanol, mercaptopropionic acid, mercaptobenzothiazole, mercaptomethylimidazole, methoxyphenol, propyl gallate, tannic acid, thioglycerol, thiosalicylic acid, triazole, vanillin, vanillic acid, and mixtures thereof. Preferred cleaning solutions may contain mixtures of more than one corrosion-inhibiting agent.

Some preferred embodiments contain mixtures of more than one chelating agent and/or corrosion-inhibiting compound. For example, the corrosion-inhibiting agent of one preferred cleaning solution comprises a mixture of acetamidophenol and methoxyphenol. The corrosion-inhibiting agent of another preferred cleaning solution comprises a mixture of acetamidophenol and vanillin. The corrosion-inhibiting agent of still another preferred cleaning solution comprises methoxyphenol and vanillin. The chelating agent of another preferred cleaning solution comprises a mixture of gluconic acid and isopropanolamine.

One preferred cleaning solution embodiment comprises tetramethylammonium hydroxide, ethylene diamine, and a mixture of acetamidophenol and vanillin. One preferred mixture of this embodiment comprises concentrations of 2.75 wt. % tetramethylammonium hydroxide, 6 wt. % ethylene diamine, 0.75 wt. % acetamidophenol and 1 wt. % vanillin. For this embodiment, a 15× to 25× dilution with de-ionized (DI) water should be made prior to use. Another preferred cleaning solution comprises tetramethylammonium hydroxide (2.75 wt. %), ethylene diamine (8 wt. %), and a mixture of acetamidophenol (0.5 wt. %) and methoxyphenol (1.5 wt. %). Another preferred cleaning solution comprises tetramethylammonium hydroxide (4.8 wt. %), Isopropanolamine (8.5 wt. %), gluconic acid (2.0 wt. %) and propyl gallate (2.4 wt. %). Still another preferred cleaning solution comprises tetramethylammonium hydroxide (2.75 wt. %), ethylene diamine (8 wt. %), and a mixture of methoxyphenol (1.5 wt. %) and vanillin (0.5 wt. %).

Preferred cleaning solution embodiments of the current invention have a neutral to alkaline pH. Even more preferred is a pH of about 10 to about 13.

The cleaning solution may be supplied in concentrated form, or diluted with water or other suitable diluents known to one skilled in the art.

One preferred cleaning solution embodiment includes a surface-active agent to promote even wetting of the semiconductor surface. Preferred embodiments include, but are not limited to, non-ionic, anionic, cationic, zwitterionic or amphoteric surfactants or mixtures thereof.

One skilled in the art can produce the cleaning solutions of the current invention using conventional chemical mixing techniques without undue experimentation.

EXAMPLES

The present invention is illustrated in more detail with reference to the following Examples; which are for illustrative purposes and should not be construed as limiting the scope of the present invention.

Example 1

Chemicals of the present invention were tested by electrochemical impedance sprectroscopy (EIS) to determine their corrosion resistance compared to commercially available alkaline post-CMP cleaners. Blanket copper wafers were immersed in dilutions of the chemistries and connected to an electrochemical cell. The open circuit potential was measured as a function of time to determine the steady state conditions for wafers exposed to each chemistry. Once the steady state condition was found, AC voltages were applied to each wafer and resistance and capacitance values were obtained which give information on the corrosion rates and resistances of each chemical. Corrosion resistance of a preferred embodiment of the current invention were measured as 25,843 Ohms-cm2. Corrosion resistance of a commercially available product were measured at 19,226 Ohms-cm2. These results clearly demonstrate that the present invention provides a higher copper corrosion resistance when compared to a commercially available alkaline post-CMP clean. A higher corrosion resistance is important to minimize copper loss from the interconnect lines as well as to prevent the formation of lower conductivity species, such as oxides and hydroxides, on the surface of the copper lines.

Example 2

In a second study, patterned Cu/low k and blanket copper wafers were exposed to chemicals of the present invention as well as commercially available alternatives, in order to determine the aggressiveness of each chemical in attacking the copper lines. For an efficient clean, the chemistry should be effective at complexing copper in solution to facilitate removal from the dielectric regions, but should be balanced with corrosion inhibition to prevent excess removal of material from the copper lines. To study this behavior, patterned copper wafer pieces were exposed to dilutions of alkaline chemistries for 5 minutes and then analyzed by Atomic Force Microscopy (AFM). Copper regions on the wafer can then be scanned to determine the extent of roughening caused by the chemistry. FIG. 1 shows a 20×20 micron AFM scan of a copper pad on a patterned wafer exposed to a 1:20 dilution of a preferred embodiment of the present invention (Tetramethyl ammonium hydroxide+ethylene diamine+acetamidophenol+vanillin). The RMS roughness of this region following chemical exposure is 1.6 nm compared to an initial value of 1.0 nm, demonstrating that the chemistry slightly roughens the surface and highlights the copper grains, but does not substantially attack the copper. This information combined with ICPMS measurements of the copper dissolved into solution during the exposure, gives a means of comparison of the chemistries of the present invention to commercially available products.

Figure 2:
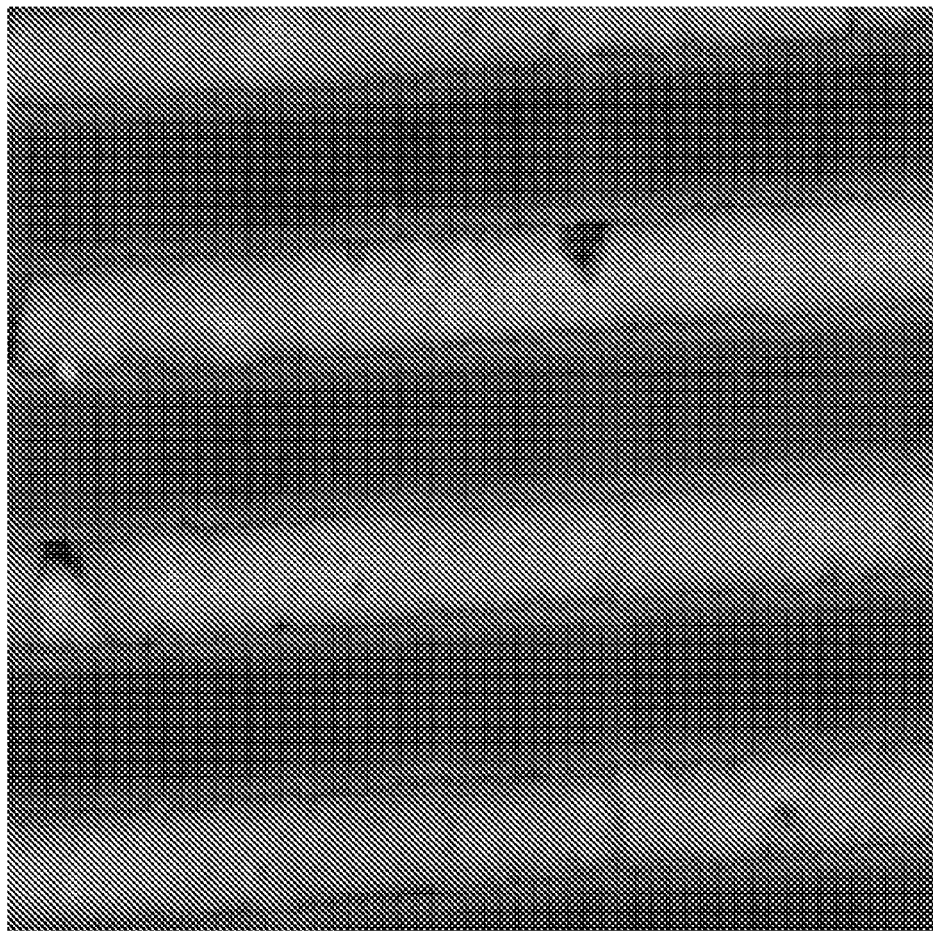
FIG. 2 is an image of Cu and low k lines on a patterned wafer exposed to a preferred embodiment of the invention.

Regions of Cu/low k lines on patterned wafers were also studied by AFM following exposure to dilutions of alkaline post CMP cleans. FIG. 2 is an example of a region of alternating copper (light regions) and low k (dark regions) lines on a wafer cleaned with a preferred embodiment of the present invention (Tetramethyl ammonium hydroxide+ethylene diamine+acetamidophenol+vanillin). The copper lines of FIG. 2 are not substantially recessed by the cleaning solution. The chemistry is capable of preserving the integrity of the copper lines during the cleaning process, removing particulate, organic and dissolved copper residues without attacking the copper to result in detrimental line recess.

Although the present invention has been described in considerable detail with reference to certain preferred versions thereof, other versions are possible. For example, the composition may be practiced in a process other than post-CMP cleaning. In addition, the cleaning of semiconductor work-pieces can be accomplished at a variety of concentrations of cleaning solution, temperature and conditions. Furthermore, the invention may be used to clean a variety of surfaces, including but not limited to surfaces containing copper, silicon, and dielectric films. Therefore, the spirit and scope of the appended claims should not be limited to the description of one preferred versions contained herein. The intention of the applicants is to cover all modifications, equivalents, and alternatives falling within the spirit and scope of the invention as defined by the appended claims.

What is claimed is:

1. A post CMP cleaning composition for cleaning a semiconductor work-piece after at least one CMP manufacturing step, comprising:
    (a) a cleaning agent, wherein said cleaning agent comprises a tetra alkyl ammonium hydroxide;
    (b) a chelating agent, wherein said chelating agent comprises at least one member selected from the group consisting of ethylene diamine, gluconic acid, isopropanolamine, isopropylhydroxylamine, and mixtures thereof, and
    (c) a corrosion-inhibiting compound, wherein said corrosion-inhibiting compound comprises at least one member selected from the group consisting of propyl gallate, mercaptopropionic acid, and mixtures thereof.

2. The composition of claim 1, wherein the chelating agent comprises a mixture of gluconic acid and isopropanolamine.

3. The composition of claim 1, wherein the corrosion-inhibiting compound is propyl gallate.

4. The composition of claim 1, further comprising a diluent.

5. The composition of claim 1, further comprising a surface-active agent.

6. The composition of claim 5, wherein said surface-active agent is selected from the group consisting of non-ionic, anionic, cationic, zwitterionic, and amphoteric surfactants, and mixtures thereof.

7. The composition of claim 1, wherein the pH is between about 9 to about 13.

8. A method for cleaning a semiconductor work-piece after at least one CMP manufacturing step, the method comprising the steps of:
    (a) providing a semiconductor work-piece; and
    (b) contacting said semiconductor work-piece with a cleaning solution after at least one CMP manufacturing step, said solution comprising
        (i) a cleaning agent, wherein said cleaning agent comprises a tetra alkyl ammonium hydroxide;
        (ii) a chelating agent, wherein said chelating agent comprises at least one member selected from the group consisting of ethylene diamine, gluconic acid, isopropanolamine, isopropylhydroxylamine, and mixtures thereof, and
        (iii) a corrosion-inhibiting compound, wherein said corrosion-inhibiting compound comprises at least one member selected from the group consisting of propyl gallate, mercaptopropionic acid, and mixtures thereof.

9. The method of claim 8, wherein said semiconductor work-piece comprises a metal line, a barrier material, and a dielectric.

10. The method of claim 9, wherein said metal line comprises copper.

11. The method of claim 9, wherein said barrier material comprises materials selected from the group consisting of Ta, TaN, Ti, TiN, W, and WN.

12. The method of claim 8, further comprising removing the cleaning solution from the semiconductor work-piece, wherein the cleaning solution does not contribute additional organic residue to the work-piece.

13. The method of claim 8, wherein the chelating agent comprises a mixture of gluconic acid and isopropanolamine.

14. The method of claim 8, wherein the corrosion-inhibiting compound is propyl gallate.

15. The method of claim 8, wherein said cleaning solution further comprises a diluent.

16. The method of claim 8, wherein said cleaning solution further comprises a surface-active agent.

17. The method of claim 16, wherein said surface-active agent is selected from the group consisting of non-ionic, anionic, cationic, zwitterionic, and amphoteric surfactants, and mixtures thereof.

* * * * *